(12) United States Patent
Nagasawa

(10) Patent No.: US 8,338,717 B2
(45) Date of Patent: Dec. 25, 2012

(54) CIRCUIT SUBSTRATE AND STRUCTURE USING THE SAME

(75) Inventor: Tadashi Nagasawa, Yasu (JP)

(73) Assignee: Kyocera Corporation, Kyoto (JP)

( * ) Notice: Subject to any disclaimer, the term of this patent is extended or adjusted under 35 U.S.C. 154(b) by 105 days.

(21) Appl. No.: 12/845,582

(22) Filed: Jul. 28, 2010

(65) Prior Publication Data

US 2011/0024170 A1   Feb. 3, 2011

(30) Foreign Application Priority Data

Jul. 28, 2009 (JP) ................................. 2009-175286

(51) Int. Cl.
*H05K 1/11* (2006.01)
(52) U.S. Cl. ........................ 174/262; 174/260
(58) Field of Classification Search .................. None
See application file for complete search history.

(56) References Cited

U.S. PATENT DOCUMENTS

| 4,886,699 | A  | * | 12/1989 | Carroll et al. ................. | 442/235 |
| 5,484,647 | A  | * | 1/1996  | Nakatani et al. ............... | 428/209 |
| 6,114,005 | A  | * | 9/2000  | Nagai et al. ................... | 428/114 |
| 6,245,696 | B1 | * | 6/2001  | Haas et al. .................... | 442/348 |
| 7,622,184 | B2 | * | 11/2009 | Okamoto et al. .......... | 428/299.1 |

FOREIGN PATENT DOCUMENTS

JP    2008-120922    5/2008

* cited by examiner

*Primary Examiner* — Ishwarbhai Patel
(74) *Attorney, Agent, or Firm* — DLA Piper LLP (US)

(57) ABSTRACT

A circuit substrate includes a base and conductive layers disposed on lower and upper surfaces of the substrate. The base includes resin layers and the conductive layers overlapping with each other in a plan view. The resin layers include first resin layers and a second resin layer interposed between the first resin layers. The first resin layer has a filler and the second resin layer has no filler or a filler whose amount is 1 volume % or less and smaller than an amount of the filler in the first resin layer.

6 Claims, 5 Drawing Sheets

CIRCUIT SUBSTRATE AND STRUCTURE USING THE SAME

CROSS REFERENCE TO RELATED APPLICATION(S)

The present application claims priority under 35 U.S.C. §119 to Japanese Patent Application No. 2009-175286, filed on Jul. 28, 2009, entitled "CIRCUIT SUBSTRATE", the entirety of which is incorporated by reference herein.

BACKGROUND OF THE INVENTION

1. Field of the Invention

The present invention relates to a circuit substrate used for electronic apparatuses (e.g., audiovisual apparatuses, electrical appliances, communication apparatuses, computer apparatuses, and the peripheral devices thereof).

2. Description of the Related Art

Hitherto, a mounting structure in which mounting electronic components are mounted on a circuit substrate has been used.

Japanese Unexamined Patent Application Publication No. 2008-120922 describes a circuit substrate including a base that includes a plurality of resin layers stacked one above another, and conductive layers formed on upper and lower surfaces of the base.

To increase rigidity of the circuit substrate, a filler is contained in the resin layers of the base in some cases. In such cases, because of a difference in coefficient of thermal expansion between a resin material and the filler which are contained in the resin layers, the resin material and the filler may separate from each other, and a crack may grow along a gap separating them in a vertical direction. On the other hand, during use of the circuit substrate, there is a possibility that when a voltage is applied between the conductive layers spaced from each other with the resin layer interposed therebetween, a conductive material contained in the conductive layers is ionized attributable to moisture contained in the resin layers and part of the ionized conductive materials grows into cracks in the resin layers. As a result, the conductive layers are more likely to short-circuit each other, and electrical reliability of the circuit substrate is more likely to be reduced.

BRIEF SUMMARY OF THE INVENTION

An object of the invention is to improve an electrical reliability of a circuit substrate.

According to one of the invention, a circuit substrate comprises a base and conductive layers disposed on a lower and an upper surfaces of the base. The base includes resin layers. The resin layers include first resin layers and a second resin layer interposed between the first resin layers. The first resin layer has a filler. The second resin layer has no filler or a filler whose amount is 1 volume % or less and smaller than an amount of the filler in the first resin layer.

The circuit substrate can suppress a growth of crack generated in the base, thereby reducing a short circuit between the conductive layers which are apart from each other via the base. As a result, a circuit substrate with a high electrical reliability can be obtained.

Figure 1:
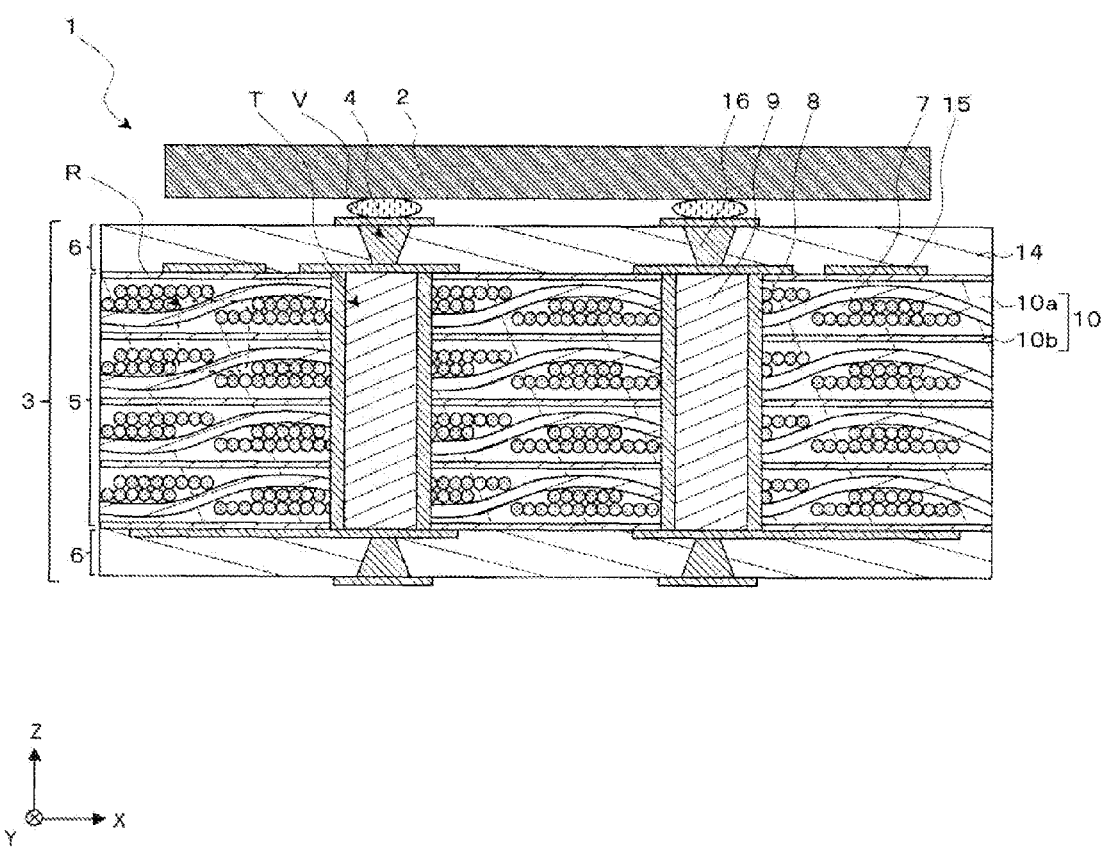
FIG. 1 is a sectional view of a mounting structure according to one embodiment of the present invention.

REFERENCE NUMERALS 1 mounting structure
2 electronic component
3 circuit substrate
4 bump
5 core substrate
6 circuit layer
7 base
8 through-hole conductor
9 insulator
10 resin layer
10a first resin layer
10b second resin layer
11 resin portion
11a first resin portion
11b second resin portion
12 base material
13 filler
14 insulating layer
15 conductive layer
16 via-conductor
17a first concave portion
17b first convex portion
17c second concave portion
17d second convex portion
18a protruding portion
18b dent portion
T through-hole
V via-hole

DETAILED DESCRIPTION OF EXEMPLARY EMBODIMENTS

A circuit substrate and a mounting structure according to an embodiment of the present invention are described below in detail with reference to the attached drawings.

A mounting structure 1 shown in FIG. 1 is used for various electronic apparatuses such as audiovisual apparatuses, electrical appliances, communication apparatuses, computer apparatuses, and the peripheral devices thereof. The mounting structure 1 includes an electronic component 2 and a circuit substrate 3.

The electronic component 2 is a semiconductor device such as IC or LSI. The electronic component may be mounted on the circuit substrate 3 through a bump 4 such as solder using a flip chip packaging technology.

The parent material of this electronic component 2 is composed of a semiconductor material, for example, silicon, germanium, gallium arsenide, gallium-arsenic-phosphorus, gallium nitride, silicon carbide, or the like. As the electronic component 2, a component having a thickness of, for example, 0.1 mm or more and 1 mm or less can be used.

The circuit substrate 3 includes a core substrate 5, circuit layers 6 on an upper surface and a lower surface of the core substrate 5.

The core substrate 5 serves to increase the strength of the circuit substrate 3 and has a thickness dimension of, for example, 0.3 mm or more and 1.5 mm or less. This core substrate 5 includes a base 7, through-holes T penetrating the base 7 in a vertical direction, through-hole conductors 8 formed along the inner wall of the through-hole T and having a cylindrical shape, and insulators 9 filled with a remaining space surrounded by the through-hole conductor 8.

The base 7 constitutes a main part of the core substrate 5. This base 7 includes a plurality of resin layers 10 stacked. Each of the resin layers 10 includes first resin layers 10a and a second resin layer 10b interposed between the adjacent first resin layers 10a.

Figure 2:
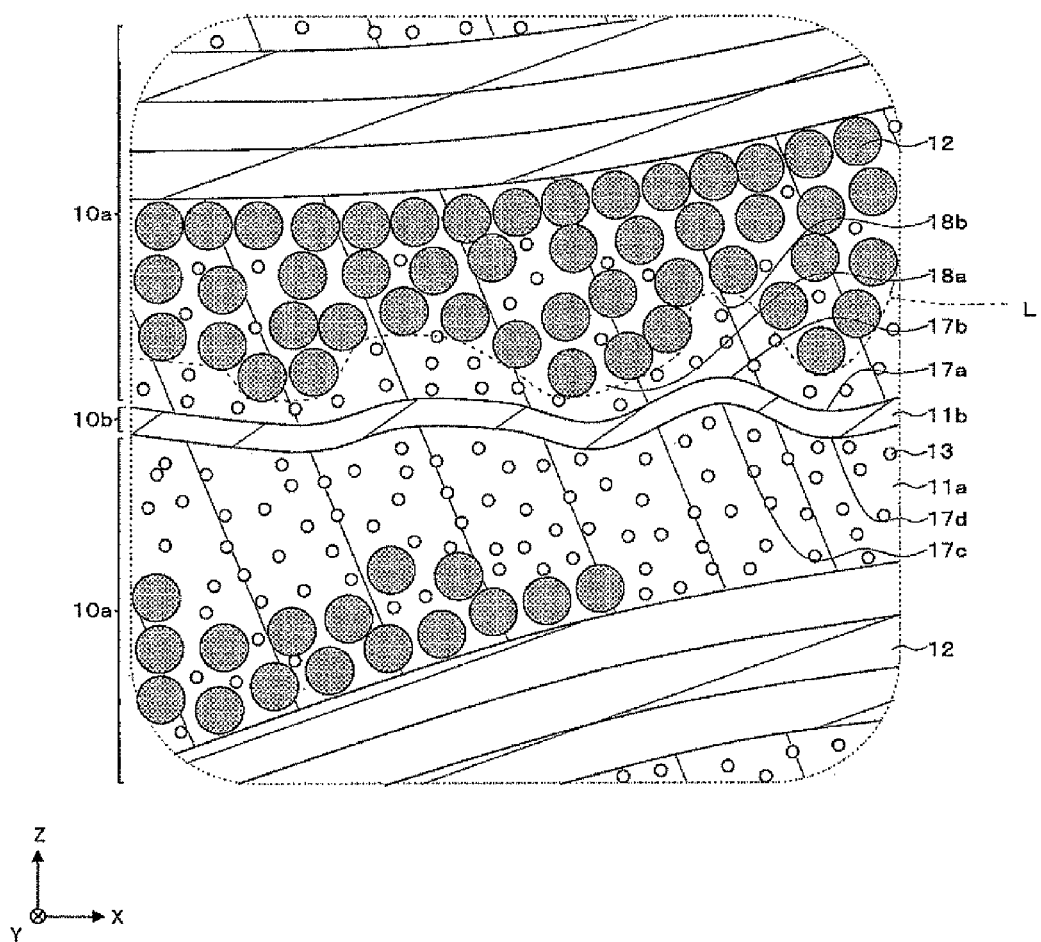
FIG. 2 is an enlarged view of a portion R of the mounting structure shown in FIG. 1.

As shown in FIG. 2, each of the first resin layers 10a includes a first resin portion 11a and a base material 12 covered with the first resin portion 11a. A thickness of the first resin layer 10a may be, for example, 15 µm to 200 µm.

The first resin portion 11a constitutes a main part of the first resin layer 10a and includes a resin material and a filler 13 made of a plurality of inorganic insulating particles.

As the resin material, various types of resin materials, such as an epoxy resin, a bismaleimide triazine resin, a cyanate resin, a poly(p-phenylenebenzobisoxazole) resin, a wholly aromatic polyamide resin, a polyimide resin, an aromatic liquid-crystal polyester resin, a polyether ether ketone resin, and a polyether ketone resin, may be optionally used. By using the resin material that has a coefficient of thermal expansion of 18 ppm/° C. or more and 45 ppm/° C. or less, the thermal expansion of the core substrate 5 can be reduced. The coefficient of thermal expansion is in conformity with ISO11359-2:1999.

The filler 13 serves to increase the strength of the core substrate 5. The filler 13 includes a plurality of inorganic insulating particles. The inorganic insulating particles may have the average diameter of for example 0.2 µm to 5 µm. As a material for the inorganic insulating particles, an inorganic insulating material such as silicon oxide (silica), silicon carbide, aluminum oxide, aluminum nitride, or aluminum hydroxide can be used. The material for the inorganic insulating particles favorably has a coefficient of thermal expansion of −5 ppm/° C. or more and 5 ppm/° C. or less, thereby reducing the thermal expansion of the core substrate 5.

Further, the content of the particles is set to be from 5 volume % to 60 volume % and favorably from 10 volume % to 60 volume %.

The average diameter of the particles is obtained by measuring maximum diameters of plural particles in a certain cross section of the first resin portion 11a, and then by calculating an average value of the measured maximum diameters. The content (volume %) of the particles is obtained by measuring an area ratio (area %) occupied by the particles with respect to the first resin portion 11a for each of plural cross sections of the first resin portion 11a, by calculating an average value of the measured area ratios, and by regarding the calculated average value as the content (volume %) of the particles.

The base material 12 serves to increase the strength of the core substrate 5, and a maximum thickness of the base material 12 in a Z direction shown in a FIG. 1 is set to be from 10 µm to 185 µm. The base material 12 favorably has a coefficient of thermal expansion of −7 ppm/° C. or more and 8 ppm/° C. or less, thereby reducing the thermal expansion of the core substrate 5.

As the base material 12, a woven fabric in which a plurality of fibers, for example, glass fibers, resin fibers, carbon fibers, or the like are woven in the warp and weft directions can be used. As the glass fibers, fibers formed of E-glass, S-glass, or the like can be used. As the resin fibers, fibers formed of a poly(p-phenylene benzbisoxazole) resin, a wholly aromatic polyamide resin, a wholly aromatic polyester resin, or the like can be used. As the carbon fibers, PAN-based carbon fibers, pitch-based carbon fibers, or the like can be used. A diameter of the fiber in a cross section perpendicular to a longitudinal direction of the fiber is set to be, for example, 4 µm to 10 µm.

The second resin layer 10b includes a second resin portion 11b and does not contain fibers and a woven fabric. A thickness of the second resin layer 10b is set to be, for example, from 2 µm to 30 µm.

The second resin portion 11b constitutes a main part of the second resin layer 10b. The second resin portion 11b contains a resin material similar to that in the first resin portion 11a, while it does not contain a filler or contains a filler of 1 volume % or less. Therefore, the second resin layer 10b does not contain a filler or contains a filler of 1 volume or less. In other words, the filler content of the second resin layer 10b is set to be 0 volume % to 1 volume % and favorably 0 volume %.

The base 7 includes a plurality of columnar through-holes T penetrating the base 7 in the vertical direction (Z direction). Cylindrical through-hole conductors 8 are formed inside the through-holes T so as to extend along inner walls of the through-holes T.

Each of the through-hole conductors 8 electrically connects the circuit layers 6 to each other, the circuit layers 6 being disposed on the upper surface and the lower surface of the core substrate 5. As these through-hole conductors 8, an electrically conductive material, for example, copper, silver, gold, aluminum, nickel, or chromium can be used.

Columnar insulators 9 are formed inside the cylindrical through-hole conductors 8. An end surface of the insulator 9 and an end surface of the through-hole conductor 8 form a support surface for a conductive layer 15 described later. The insulator 9 is made of a resin material, such as a polyimide resin, an acrylic resin, an epoxy resin, a cyanate resin, a fluorine resin, a silicone resin, a polyphenylene ether resin, or a bismaleimide triazine resin.

Each of the circuit layers 6 disposed on the upper and lower surfaces of the core substrate 5 includes an insulating layer 14, conductive layers 15, via-holes V, and via-conductors 16. The conductive layers 15 and the via-conductors 16 are electrically connected to each other, thereby constituting circuit portions. The circuit portions include power supply line and signal lines.

The insulating layer 14 serves to ensure insulation in portions of the circuit layer 6 other than the circuit portions, and it is formed in thickness of, for example, 1 µm to 15 µm. The insulating layer 14 can be formed by using, e.g., a polyimide resin, an acrylic resin, an epoxy resin, an urethane resin, a cyanate resin, a silicone resin, a bismaleimide triazine resin, a liquid crystal polymer, a polybenzoxazole resin, a polyimide-benzoxazole resin, or the like. The insulating layer 14 may contain a filler as the first resin layer 10a.

The conductive layers 15 constitute the circuit portions together with the via-conductors 16 described later in detail. The conductive layers 15 are formed on upper and lower surfaces of the base 7 and upper and lower surfaces of the insulating layer 14 in a state separated from each other in the vertical direction of the circuit substrate 3. The conductive layers 15 can be each formed by using a metallic material, such as copper, silver, gold, aluminum, nickel, or chromium.

The insulating layer 14 includes the via-holes V penetrating the insulating layer 14 in the vertical direction and having a tapered shape gradually narrowing toward the core substrate 5. The via-conductors 16 are formed inside the via-holes V.

The via-conductor 16 serves to connect the conductive layers 15 to each other, and it can be formed by using a conductive material, such as copper, silver, gold, aluminum, nickel, or chromium.

In some cases, the resin material and the filler 13 both contained in the resin layer 10 may separate from each other, and a crack may be generated due to the separation.

Taking such a separation into account, in the circuit substrate 3 according to this embodiment, the resin layer 10 positioned between the conductive layers 15 which overlap with each other in a plan view, includes the second resin layer 10b which contains no filler and which is interposed between adjacent two of the first resin layers 10a. Because the second resin layer 10b contains no filler, separation (peeling-off) attributable to the filler is less likely to occur in the second resin layer 10b. Accordingly, the growth of a crack generated in the first resin layer 10a can be suppressed by the presence of the second resin layer 10b. As a result, when a voltage is applied between the conductive layers 15, the growth of the ionized conductive material of the conductive layers 15 can be suppressed and a short circuit between the conductive layers 15 through the crack can be reduced. Hence, the circuit substrate 3 with high electrical reliability can be obtained.

Further, since the first resin layer 10a contains the filler 13 and has a high Young's modulus, there is a possibility that when an external force is applied to the base 7 and the first resin layer 10a is caused to deform, internal stresses may be generated at such a high level as generating a crack. In the circuit substrate 3 according to this embodiment, however, since the second resin layer 10b containing no filler and having a low Young's modulus is disposed between adjacent two of the first resin layers 10a, the deformation of each first resin layer 10a is reduced by the presence of the second resin layer 10b that tends to more easily deform. In addition, internal stresses generated in the first resin layer 10a are reduced when the external force is applied to the base 7. Consequently, a possibility of generation of the crack in the first resin layer 10a can be reduced.

The first resin portion 11a and the second resin portion 11b desirably include the same resin material. This is effective in making the coefficient of thermal expansion, rigidity, etc. more uniform in the base 7, and in reducing warp and distortion of the core substrate 5.

Further, the thickness of the second resin layer 10b is desirably smaller than that of the first resin layer 10a. As a result, the filler content in the entirety of the base 7 can be increased so as to increase the rigidity of the core substrate 5 and to reduce the coefficient of thermal expansion thereof, while ensuring that the growth of cracks in the base 7 can be efficiently suppressed. The thickness of the second resin layer 10b is set to be, for example, from 2% to 15% of the thickness of the first resin layer 10a. In addition, the thickness of the second resin layer 10b is desirably set to be smaller than the diameter of the cross section of the fiber constituting the base material 12, which is perpendicular to the longitudinal direction of the fiber.

The second resin layer 10b is desirably formed between adjacent two of all the first resin layers 10a. As a result, the growth of cracks can be more effectively suppressed, and therefore the growth of cracks in the base 7 can be efficiently reduced.

The first resin portion 11a of the first resin layer 10a containing the filler 13 is desirably interposed between the base material 12 of the first resin layer 10a and the second resin layer 10b containing no filler in a case that the second resin layer 10b has the largest coefficient of thermal expansion and the first resin portion 11a has the second largest coefficient of the thermal expansion among the base material 12, the first resin portion 11a, and the second resin layer 10b. The first resin portion 11a interposed between the base material 12 and the second resin layer 10b can reduce thermal stress applied between the base material 12 and the second resin layer 10b. Accordingly, it is possible to suppress separation (peeling-off) attributable to the difference in thermal expansion between the first resin layer 10a and the second resin layer 10b. Further, since effects caused by the difference in rigidity between the base material 12 and the second resin layer 10b can be reduced by the presence of the first resin portion 11a, it is possible to suppress separation (peeling-off) attributable to the difference in rigidity between the first resin layer 10a and the second resin layer 10b.

The second resin layer 10b has a first concave portion 17a and a first convex portion 17b on the upper surface side thereof, which increases a contact area between the second resin layer 10b and the first resin layer 10a and enhances the strength of bonding between the first resin layer 10a and the second resin layer 10b, thereby suppressing the separation attributable to the difference in thermal expansion between the first resin layer 10a and the second resin layer 10b. As a result, cracks can be less likely to be generated in the resin layer 10 and grow in a planar direction (i.e., in an XY-plane direction) with the occurrence of the separation, and a short circuit between the adjacent through-hole conductors 8, which is caused by the crack, can be suppressed.

The second resin layer 10b further has a second concave portion 17c and a second convex portion 17d on the lower surface side thereof. Desirably, the first concave portion 17a is positioned to correspond to the second convex portion 17d, and the first convex portion 17b is positioned to correspond to and the second concave portion 17c. As a result, the separation of the second resin layer 10b from the first resin layers 10a positioned on the upper and lower surface sides of the second resin layer 10b can be suppressed, and the thickness of the second resin layer 10b can be made more uniform. Hence, the content of the filler 13 in the base 7 can be made more uniform in the vertical direction, and the coefficient of thermal expansion of the base 7 can also be made more uniform in the vertical direction, whereby warp and distortion of the core substrate 5 can be reduced.

The base material 12 of the first resin layer 10a positioned in the upper side of the second resin layer 10b has a protruding portion 18a and a dent portion 18b at a lower surface thereof. Desirably, the first concave portion 17a of the second resin layer 10b is arranged to correspond to and the protruding portion 18a of the base material 12, and the first convex portion 17b of the second resin layer 10b is arranged to correspond to and the dent portion 18b of the base material 12. With such arrangements, the first concave portion 17a and the first convex portion 17b serve to reduce the separation between the first resin layer 10a and the second resin layer 10b, and to make the distance between the second resin layer 10b and the base material 12 more uniform. As a result, thermal stress caused by the difference in thermal expansion between the base material 12 and the second resin layer 10b can be reduced by the presence of the first resin portion 11a. Further, effects caused by the difference in rigidity between the base material 12 and the second resin layer 10b can be reduced by the presence of the first resin portion 11a.

The protruding portion 18a and the dent portion 18b can be understood as follows. Look at a fiber layer that constitutes an outermost (lowermost) layer of the base material 12 in the cross section shown in FIG. 2. For individual fibers constituting the outermost fiber layer, an imaginary curve L is drawn by continuously interconnecting points of the individual fibers, which are positioned closest to the second resin layer 10b, with a cubic spline curve, for example. A portion of the imaginary curve L which is in the form protruding toward the second resin layer 10b is referred to as the "protruding portion 18a", and a portion of the imaginary curve L which is in the form dented toward the base material 12 is referred to as the "dent portion 18b".

Such a positional relation between the base material 12 and the second resin layer 10b is desirably applied to between the second resin layer 10b and a portion of the base material 12, which is positioned closest to the second resin layer 10b. As a result, effects caused by the differences in coefficient of thermal expansion and in rigidity between the base material 12 and the second resin layer 10b can be reduced in a region defined between the second resin layer 10b and the portion of the base material 12, which is positioned closest to the second resin layer 10b, the region being more susceptible to effects caused by the differences in coefficient of thermal expansion and in rigidity between the base material 12 and the second resin layer 10b.

Desirably, the first convex portion 17b of the second resin layer 10b is partly disposed within the dent portion 18b of the base material 12. As a result, the first convex portion 17b is surrounded by the base material 12 having high rigidity within the dent portion 18b, whereby the strength of bonding between the first resin layer 10a and the second resin layer 10b can be increased and the separation between the first resin layer 10a and the second resin layer 10b can be reduced.

The second resin layer 10b may be formed entirely or partly in the planar direction between adjacent two of the first resin layer 10a.

The mounting structure 1 thus constructed develops the desired function by driving or controlling the electronic component 2 in accordance with electric power and signals supplied through the circuit substrate 3.

Figure 4A:
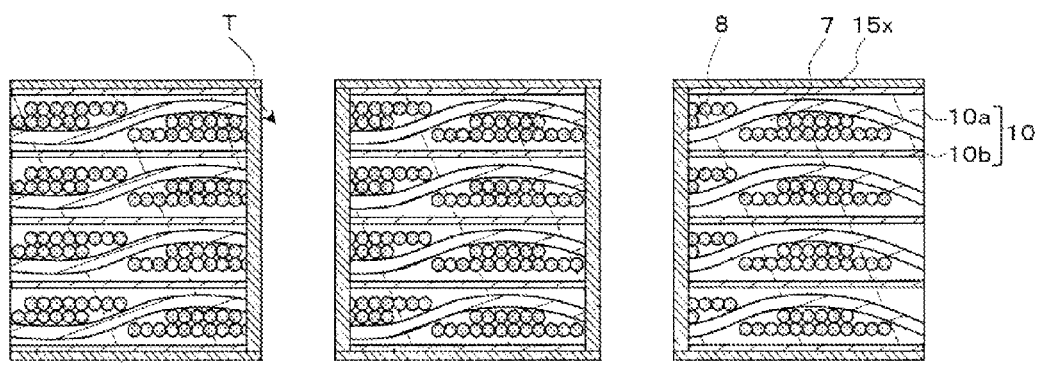
FIGS. 4A, 4B and 4C are sectional views for explaining steps of manufacturing the mounting structure shown in FIG. 1.
Figure 4B:
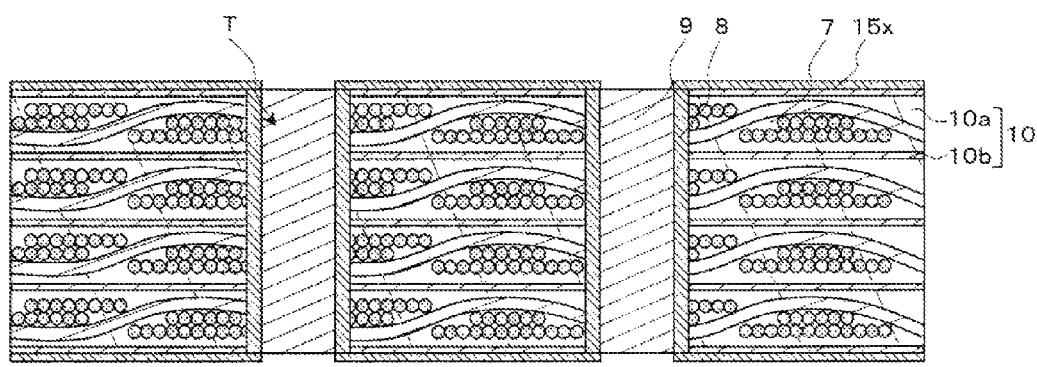
Figure 4C:
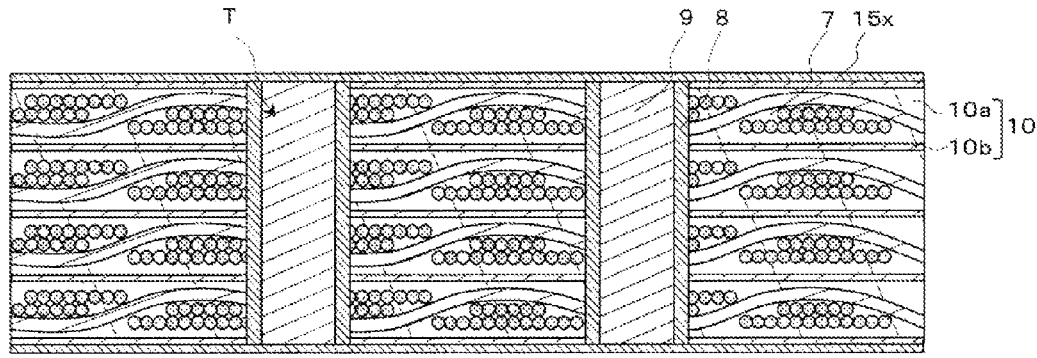
Figure 5A:
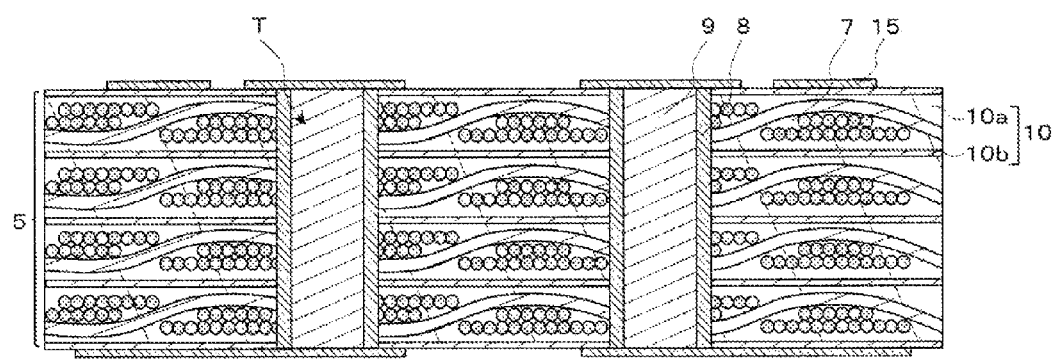
FIGS. 5A and 5B are sectional views for explaining steps of manufacturing the mounting structure shown in FIG. 1.

Next, a method of manufacturing the mounting structure 1 is described with reference to FIGS. 3 to 5.

Figure 3A:
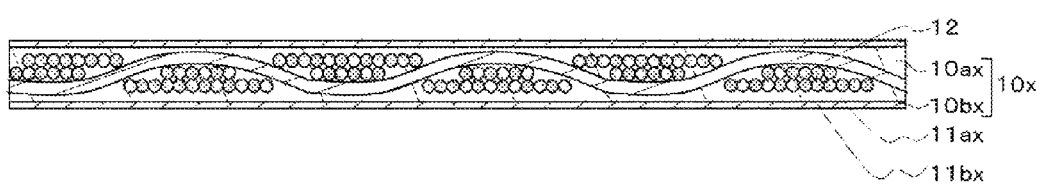
FIGS. 3A, 3B and 3C are sectional views for explaining steps of manufacturing the mounting structure shown in FIG. 1.

(1) As shown in FIG. 3A, a first precursor sheet 10ax serving as the first resin layer is prepared. Further, a resin sheet 10x is prepared which includes the first precursor sheet 10ax and second precursor sheets 10bx each serving as the second resin layer and disposed on upper and lower surfaces of the first precursor sheet 10ax. An exemplary method of preparing the resin sheet is as follows.

First, the base material 12 is impregnated with a uncured resin containing the filler, thereby forming the first precursor sheet 10ax. Then, an uncured resin containing no filler is coated on the upper and lower surfaces of the first precursor sheet 10ax, thereby forming the second precursor sheets 10bx. The expression "uncured" means the state of A-stage or B-stage in conformity with ISO472:1999.

The resin sheet 10x can be fabricated as described above.

Figure 3B:
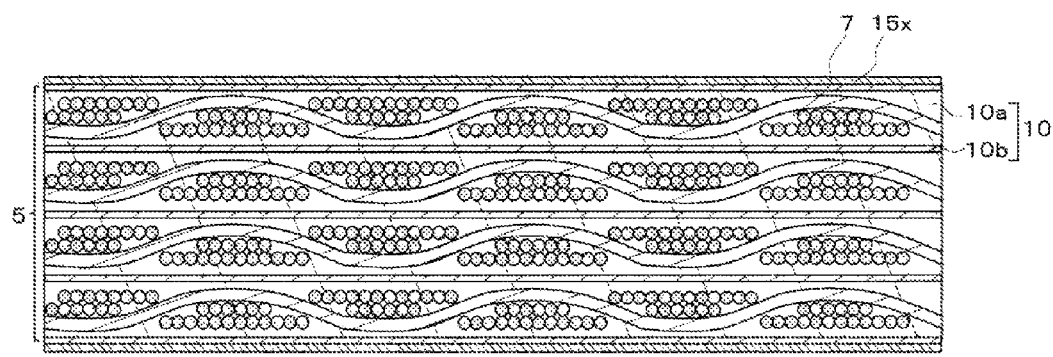
Figure 3C:
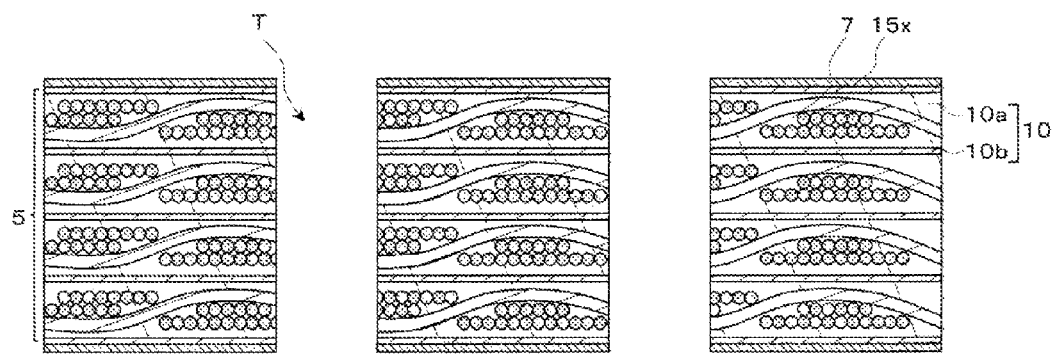

(2) As shown in FIG. 3B, the base 7 is fabricated by stacking the plurality of resin sheets 10x one above another with the second precursor sheet 10bx interposed between the adjacent resin sheets 10x, and then by heating them. An exemplary method of fabricating the base 7 is as follows.

First, the plurality of resin sheets 10x are stacked one above another with the second precursor sheet 10bx interposed between the adjacent resin sheets 10x, and copper foils 15x are laminated on uppermost and lowermost layers of the stacked sheets, thereby forming a laminate (layered body). Then, the laminate is heated to the curing start temperature of the resin included in the resin layers 10 or more and temperature lower than the thermal decomposition temperature thereof while the laminate is pressed in the vertical direction, thereby curing the uncured resin. As a result, the first precursor sheet 10ax becomes the first resin layer 10a, the second precursor sheet 10bx becomes the second resin layer 10b, and the resin sheet 10x becomes the resin layer 10, whereby the base 7 is fabricated. The term "curing start temperature" means the temperature at which the resin comes into the state of C stage in conformity with ISO472:1999. Also, the term "thermal decomposition temperature" means the temperature at which the mass of the resin is reduced 5% in the thermal weight measurement in conformity with ISO11358:1997.

During the heating and the pressing, a first resin 11ax in the first precursor sheet 10ax and a second resin 11bx in the second precursor sheet 10bx flow. By utilizing the flow of the first and the second resins 11ax and 11bx, the first concave portion 17a, the first convex portion 17b, the second concave portion 17c, and the second convex portion 17d can be formed in the second resin layer 10b.

More specifically, the first concave portion 17a, the first convex portion 17b, the second concave portion 17c, and the second convex portion 17d may be formed as described below. First, the first resin 11ax in the first precursor sheet 10ax, which is positioned between the second precursor sheet 10bx and the base material 12 closest to the second precursor sheet 10bx, flows so as to make the thickness of the laminate (layered body) more uniform. Then, the second resin 11bx in the second precursor sheet 10bx is caused to flow in the vertical direction corresponding to the above-mentioned flow of the first resin 11ax. As a result, the first concave portion 17a, the first convex portion 17b, the second concave portion 17c, and the second convex portion 17d are formed.

Here, it is important to adjust the temperature during the heating and the pressing such that the viscosity of both the first resin 11ax and the second resin 11bx is held at 10 KPa·s to 500 KPa·s. By moderately raising the temperature during the heating and the pressing to set the viscosity to be 10 KPa·s or more, the second resin 11bx can be cured while the first resin 11ax and the second resin 11bx are suppressed from flowing and mixing with each other. Thus, the second resin layer 10b can be efficiently formed. Also, by setting the viscosity to be 500 KPa·s or less, the fluidity of both the first resin 11ax and the second resin 11bx can be reduced so as to suppress generation of gaps.

The base 7 can be fabricated as described above.

(3) As shown in FIGS. 3C through 5A, the core substrate 5 is fabricated by forming the through-hole conductors 8 and the conductive layers 15 in and on the base 7. Specifically, an exemplary method of fabricating the core substrate 5 is as follows.

First, a plurality of through-holes T penetrating the core substrate 5 in the vertical direction are formed by, e.g., drilling or laser machining. Then, a conductive material is coated on inner wall surfaces of the through-holes T by, e.g., electroless plating, vapor deposition, CVD, or sputtering, thereby forming the through-hole conductors 8 each having a cylindrical shape. Subsequently, a resin material, etc. are filled in the cylindrical through-hole conductors 8, thereby forming the insulators 9. Then, a conductive material is coated on exposed surfaces of the insulators 9 by, e.g., electroless plating, vapor deposition, CVD, or sputtering, thereby forming the copper foils 15x. Further, the copper foils 15x are patterned by the known technique, such as photolithography or etching, thereby forming the conductive layers 15.

The core substrate 5 can be fabricated as described above.

Figure 5B:
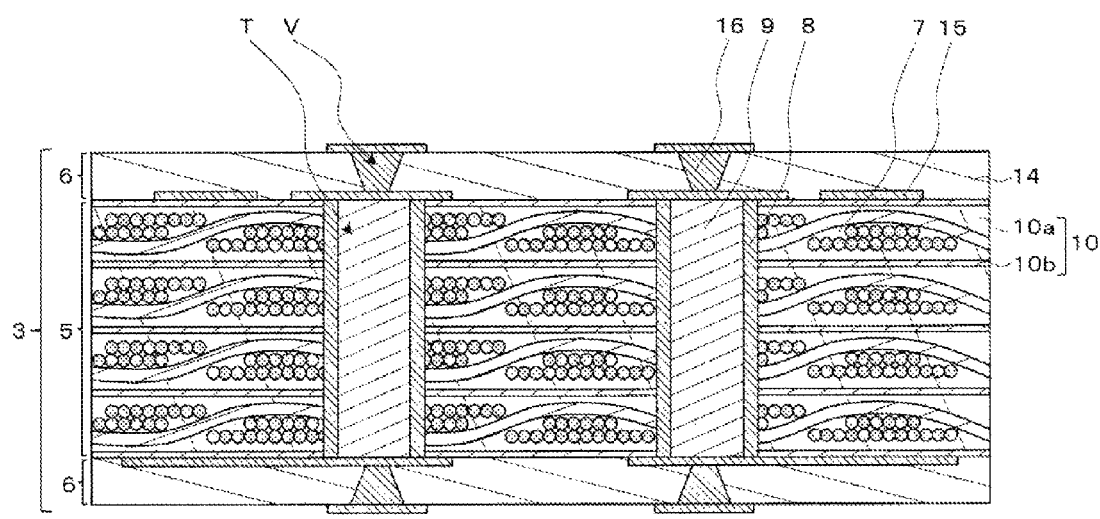

(4) As shown in FIG. 5B, the circuit substrate 3 is fabricated by forming the circuit layers 6 on both the surfaces of the core substrate 5.

Specifically, first, a uncured resin is disposed on each of the conductive layers 15 and is heated so as to flow in close contact with the conductive layer 15. The resin is further heated to be cured, thereby forming the insulating layer 14 on the conductive layer 15. Then, by using, e.g., a YAG laser device or a carbon dioxide laser device, the via-holes V are formed in the insulating layer 14 such that at least part of the conductive layer 15 is exposed in the via-holes V. Then, the via-conductors 13 are formed in the via-holes V and the conductive layer 15 is formed on an upper surface of the insulating layer 14 by using, e.g., a semi-additive process, a subtractive process, or a full-additive process, thereby forming the circuit layer 6.

The circuit substrate 3 can be fabricated as described above. The circuit substrate 3 having multilayer wiring can also be fabricated by repeating the above-described step.

(5) The mounting structure 1, shown in FIG. 1, can be fabricated by flip-chip mounting the electronic component 2 onto the circuit substrate 3 with the bumps 4 interposed between them.

The present invention is not limited to the above-described embodiment and can be variously modified and improved within the scope not departing from the gist of the present invention.

In the above-described embodiment of the present invention, the base material 12 includes a woven fabric in which a plurality of fibers are woven in the lengthwise and lateral directions, however, the base material does not need to include the wove fabric. For example, the base material may include fibers aligned in one direction instead of the woven fabric. Furthermore, the base material itself does not need to be included in the first resin layer.

Further, the number of the resin layers may be optionally set so long as it is two or more.

In the above-described embodiment of the present invention, the second precursor sheet of the resin sheet prepared in the step (1) is formed by coating the uncured resin containing no filler on the upper and lower surfaces of the first precursor sheet. The second precursor sheet may also be formed as follows.

First, a resin sheet is prepared by impregnating the base material with a varnish that contains a resin, a solvent for dissolving the resin, and a filler. The solvent used here is a solvent having molecular weight of 70 g/mol or more. Then, the solvent contained in the resin sheet is evaporated, whereby the upper and lower portions of the resin sheet become a no-filler region corresponding to the second precursor sheet, and the middle portion of the resin sheet become a filler region corresponding to the first precursor sheet.

The above modification is presumably based on the following mechanism. Because the resin is dissolved in the solvent, resin molecules and solvent molecules have high affinity. Further, the molecular weight of the solvent molecule is large. Accordingly, when the solvent is evaporated, the resin molecules are caused to move up to the upper and lower surfaces of the resin sheet together with movement of the solvent molecules. As a result, the no-filler regions are formed on the upper and the lower portions of the resin sheet. The molecular weight is in conformity with JIS C5600:2006.

As the above-mentioned resin, a phenol resin, an epoxy resin, a polyimide resin, a polyester resin, an aromatic liquid-crystal polyester resin, a bismaleimidetriazine resin, or the like can be used.

As the above-mentioned solvent having molecular weight of 70 g/mol or more, for example, alcohol having molecular weight not smaller than that of butanol (molecular weight of 74 g/mol), an organic solvent containing, e.g., an amide component, or the like can be used. Practical examples of the solvent include methyl ethyl ketone (molecular weight of 72 g/mol), toluene (molecular weight of 92 g/mol), xylene (molecular weight of 106 g/mol), methyl isobutyl ketone (molecular weight of 100 g/mol), ethylacetate (molecular weight of 88 g/mol), ethylene glycol monomethyl ether (molecular weight of 118 g/mol), N,N-dimethylformamide (molecular weight of 73 g/mol), and N,N-dimethylacetamide (molecular weight of 87 g/mol). Those solvents may be used alone or in combination of two or more selected from them.

In order to dissolve the resin in the solvent and to move the resin molecules together with the evaporated solvent molecules, a combination of a resin material and a solvent material needs to be selected as appropriate. For example, when a polyimide resin is used as the resin, N,N-dimethylacetamide, N,N-dimethylformamide, N,N-diethylacetamide, or parachlolophenol is desirably used as the solvent. Also, when an aromatic liquid-crystal polyester resin is used as the resin, N,N-dimethylacetamide, N,N-dimethylformamide N,N-methylpyrrolidone, or dimethylsulfoxide is desirably used as the solvent.

Further, in order to move the resin molecules together with the evaporated solvent molecules, a drying method used for evaporating the solvent, a drying time, and a temperature during the drying, etc. need to be selected as appropriate. For example, the drying is performed at temperature that is not lower than a midpoint between the boiling temperature of the solvent and the room temperature, but that is lower than the curing start temperature of the resin included in the first precursor sheet. As a result, the solvent can be evaporated while suppressing curing of the resin, whereby fluidity of the resin molecules during the drying can be increased and the resin molecules can be efficiently moved up to the upper and lower surfaces of the resin sheet together with the evaporated solvent molecules. Hence, the second precursor sheet can be efficiently formed.

What is claimed is:

1. A circuit substrate comprising:
a base including a plurality of resin layers; and
conductive layers disposed on a lower and an upper surfaces of the base;
wherein the resin layers include first resin layers including a filler, and a second resin layer interposed between the first resin layers and having no filler or a filler whose amount is smaller than an amount of the filler in the first resin layer and 1 volume % or less,
wherein the first resin layer includes a base material and a resin portion, the base material is made of fibers, the resin portion includes a filler, and the resin portion of the first resin layer is interposed between the base material and the second resin layer, and
wherein the second resin layer includes a first concave portion and a first convex portion on an upper surface thereof and a second concave portion and a second convex portion on a lower surface thereof, the first concave portion corresponds to the second convex portion, and the first convex portion corresponds to the second concave portion.

2. The circuit substrate according to claim 1, wherein the first and the second resin layers includes the same resin material.

3. The circuit substrate according to claim 1, wherein a thickness of the second resin layer is smaller than that of the first resin layer.

4. The circuit substrate according to claim 1, wherein the first resin layer formed on the upper surface of the second resin layer includes a resin portion and a base material including a protruding portion and a dent portion on a lower surface of the base material, the first concave portion corresponds to the protruding portion, and the first convex portion corresponds to the dent portion.

5. A structure comprising:

the circuit substrate according to claim 1, and an electronic component electrically connected to the circuit substrate.

6. A circuit substrate comprising:

a base including a plurality of resin layers; and conductive layers disposed on a lower and an upper surfaces of the base;

wherein the resin layers include first resin layers including a filler, and a second resin layer interposed between the first resin layers and having no filler or a filler whose amount is smaller than an amount of the filler in the first resin layer and 1 volume % or less, wherein the first resin layer includes a base material and a resin portion, the base material is made of fibers, the resin portion includes a filler, and the resin portion of the first resin layer is interposed between the base material and the second resin layer, and wherein the second resin layer is wavy.

* * * * *